United States Patent
Fitzgerald (12) 
(10) Patent No.: US 6,518,644 B2
(45) Date of Patent: Feb. 11, 2003

(54) LOW THREADING DISLOCATION DENSITY RELAXED MISMATCHED EPILAYERS WITHOUT HIGH TEMPERATURE GROWTH

(75) Inventor: Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 09/761,508

(22) Filed: Jan. 16, 2001

(65) Prior Publication Data

US 2002/0005514 A1 Jan. 17, 2002

Related U.S. Application Data

(60) Provisional application No. 60/177,085, filed on Jan. 20, 2000.

(51) Int. Cl.[7] .............................................. H01L 31/117
(52) U.S. Cl. ...................... 257/616; 257/191; 438/478
(58) Field of Search .................................. 257/616, 191, 257/347, 190; 372/45; 438/478, 363

(56) References Cited

U.S. PATENT DOCUMENTS

| | | | |
|---|---|---|---|
| 4,900,372 A | 2/1990 | Lee et al. | 148/33.4 |
| 5,208,182 A | 5/1993 | Narayan et al. | |
| 5,210,052 A | 5/1993 | Takasaki | |
| 5,221,413 A | 6/1993 | Brasen et al. | |
| 5,252,173 A | 10/1993 | Inoue | |
| 5,279,687 A | 1/1994 | Tuppen et al. | |
| 5,308,444 A | 5/1994 | Fitzgerald, Jr. et al. | |
| 5,442,205 A | 8/1995 | Brasen et al. | |
| 5,810,924 A | 9/1998 | Legoues et al. | |
| 6,107,653 A | 8/2000 | Fitzgerald | |
| 6,117,750 A | 9/2000 | Bensahel et al. | |

FOREIGN PATENT DOCUMENTS

JP 63073398 3/1988

OTHER PUBLICATIONS

"Relaxed $Ge_xSi_{1-x}$ structures for III–V integration with Si and high mobility two–dimensional electron gases in Si"; by Fitzgerald et al. 1992 American Vacuum society; pp. 1807–1819.

"GeSi/Si Nanostructures" by E.A. Fitzgerald; Department of Materials Science, Massachusetts Institute of Technology (1995) pp. 1–15.

Hsin–Chiao Luan et al., "High–quality Ge epilayers on Si with low threading–dislocation densities," *Applied Physics Letters*, American Institute of Physics, New York, vol. 75, No. 19, Nov. 8, 1999, pp. 2909–2911.

Primary Examiner—David Nelms
Assistant Examiner—Thinh Nguyen
(74) Attorney, Agent, or Firm—Testa, Hurwitz & Thibeault, LLP (57) ABSTRACT

A semiconductor structure and method of processing same including a substrate, a lattice-mismatched first layer deposited on the substrate and annealed at a temperature greater than 100° C. above the deposition temperature, and a second layer deposited on the first layer with a greater lattice mismatch to the substrate than the first semiconductor layer. In another embodiment there is provided a semiconductor graded composition layer structure on a semiconductor substrate and a method of processing same including a semiconductor substrate, a first semiconductor layer having a series of lattice-mismatched semiconductor layers deposited on the substrate and annealed at a temperature greater than 100° C. above the deposition temperature, a second semiconductor layer deposited on the first semiconductor layer with a greater lattice mismatch to the substrate than the first semiconductor layer, and annealed at a temperature greater than 100° C. above the deposition temperature of the second semiconductor layer.

30 Claims, 3 Drawing Sheets

FIG. 1A

1. DEPOSIT LATTICE MISMATCHED LAYER AT LOW T

FIG. 1B

2. ANNEAL AT HIGH T TO INCREASE DISLOCATION FLOW AND REDUCE DISLOCATION DENSITY

4. REPEAT ANNEAL AND DEPOSITION UNTIL DESIRED STRUCTURE IS ACHIEVED

FIG. 1C

3. DEPOSIT SUBSEQUENT LAYER WITH INCREASED LATTICE MISMATCHED AT LOW T

| SAMPLE | TOTAL THREADING DISLOCATION DENSITY (# / cm²) | FIELD THREADING DISLOCATION DENSITY (# / cm²) |
|---|---|---|
| 20% SiGe ON Si WITH GRADED BUFFER AS GROWN | $1.36 \times 10^6$ | $1.31 \times 10^6$ |
| 20% SiGe ON Si WITH GRADED BUFFER AFTER A 5 MIN ANNEAL AT 1050 °C | $7.25 \times 10^5$ | $5.48 \times 10^5$ |

FIG. 5

LOW THREADING DISLOCATION DENSITY RELAXED MISMATCHED EPILAYERS WITHOUT HIGH TEMPERATURE GROWTH

This application claims priority to provisional application Ser. No. 60/177,085 filed Jan. 20, 2000.

BACKGROUND OF THE INVENTION

The invention relates to the field of low threading dislocation density relaxed mismatched epilayers, and in particular to such epilayers grown without high temperature.

The goal of combining different materials on a common substrate is desirable for a variety of integrated systems. Specifically, it has been a long-standing desire to combine different semiconductor and oxide materials on a common useful substrate such as a silicon substrate. However, just as the different materials properties are beneficial from the system application perspective, other properties may make such materials combinations problematic in processing. For example, semiconductor materials with different properties often have different lattice constants. Therefore, upon deposition of one semiconductor material on top of another substrate material can result in many defects in the semiconductor layer, rendering it useless for practical application.

Seminal work into the quantitative interpretation of dislocation densities and the connection to growth parameters was accomplished in the early 1990's (see, for example, E. A. Fitzgerald et al. J. Vac. Sci Tech. B 10,1807 (1992)). Using relaxed SiGe alloys on Si as the model system, it was realized that higher temperature growth of compositionally graded layers was a key to producing a relaxed SiGe layer on Si with high perfection.

However, practical constraints from current equipment used to manufacture Si-based epitaxial layers create difficulty in depositing high germanium concentration alloys without deleterious particle formation from either gas phase nucleation or equipment coating. For example, a large amount of current Si-based epitaxial wafers are created using single-wafer, rapid thermal chemical vapor deposition (CVD) systems. Although these systems offer great control of Si epilayer thickness uniformity across a wafer, the process encounters problems when germane is added to the gas stream to deposit SiGe alloy layers. Due to the lower decomposition temperature of germane than silane, dichlorosilane, or trichlorosilane, it is possible to nucleate germanium particles in the gas stream, or to coat parts of the reactor with thick deposits that can lead to particle generation.

The overall effect is that the epitaxial growth on the Si wafer can incorporate many particles, which not only degrade material quality locally, but also act as heterogeneous nucleation sites for additional threading dislocations, decreasing overall material quality. Particle generation occurs more rapidly with higher growth temperature; thus, the growth conditions that lead to lower threading dislocation densities (i.e. higher growth temperatures), unfortunately lead to more particles and a higher threading dislocation density than expected. Lower growth temperatures that avoid higher particle generation will create a higher threading dislocation density.

SUMMARY OF THE INVENTION

The problems of the prior art can be overcome by developing a method to create high dislocation velocities even though deposition occurs at lower growth temperatures. Accordingly, the invention provides a structure and a method to produce a low threading dislocation density, mismatched epilayer without the need for depositing the film at high temperature, thus avoiding the germane particle generation.

In accordance with an embodiment of the invention there is provided a semiconductor structure and method of processing same including a substrate, a lattice-mismatched first layer deposited on the substrate and annealed at a temperature greater than 100° C. above the deposition temperature, and a second layer deposited on the first layer with a greater lattice mismatch to the substrate than the first semiconductor layer.

In another embodiment there is provided a semiconductor graded composition layer structure on a semiconductor substrate and a method of processing same including a semiconductor substrate, a first semiconductor layer having a series of lattice-mismatched semiconductor layers deposited on the substrate and annealed at a temperature greater than 100° C. above the deposition temperature, a second semiconductor layer deposited on the first semiconductor layer with a greater lattice mismatch to the substrate than the first semiconductor layer, and annealed at a temperature greater than 100° C. above the deposition temperature of the second semiconductor layer.

DETAILED DESCRIPTION OF THE INVENTION

Figure 1A:
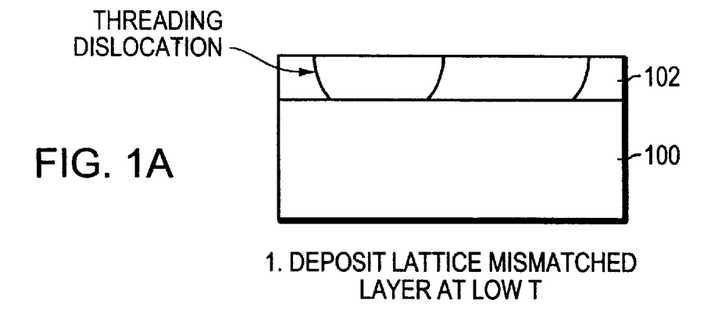
FIGS. 1A–1C is a schematic block diagram of the growth process and subsequent structure of low dislocation density, lattice mismatched films using alternating steps of epitaxial growth and high temperature annealing.
Figure 1B:
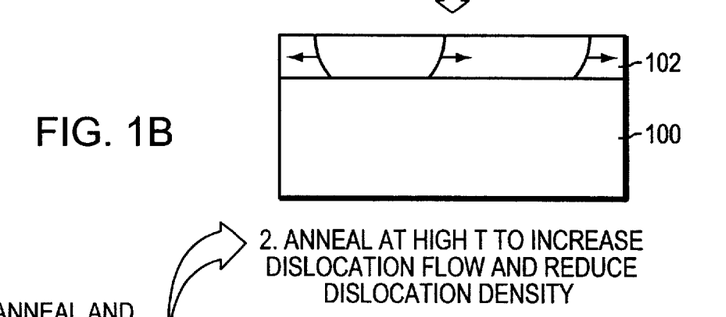
Figure 1C:
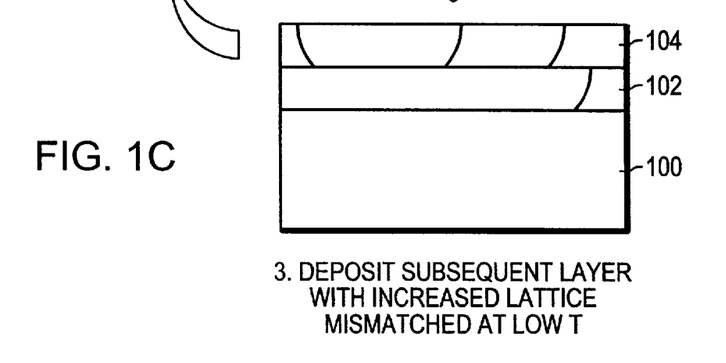

FIGS. 1A–1C is a schematic block diagram of the growth process and subsequent structure of low dislocation density, lattice mismatched films using alternating steps of epitaxial growth and high temperature annealing. In accordance with an exemplary embodiment of the invention, a relatively low lattice-mismatched film 102 is deposited on a surface of a substrate 100 with a different lattice constant at a low temperature, i.e., where particle generation is at a minimum. A low mismatched film can be defined as one in which the lattice mismatch is less than 1%.

After deposition of the film 102, the film is annealed at high temperature without any deposition source gas flowing across the surface, i.e., hydrogen or nitrogen, since they do not deposit any atoms on the surface. This annealing step increases dislocation flow and nearly completely relaxes the deposited film. Because the mismatch is low, the threading dislocation density remains low. Also, the rapid thermal feature of many CVD reactors is a benefit, since wafer temperature can be changed rapidly with time. If the CVD equipment has a large thermal mass, i.e., in the non-rapid thermal arrangement, this procedure is impractical since the annealing step would require too much time, and therefore increase the cost of manufacturing.

The first two aforementioned steps can be repeated, increasing the lattice mismatch in subsequent layers 104. After this sequence, a relaxed graded composition structure is formed, yet the high temperatures during the growth cycle have been avoided, and therefore the particle problem is minimized.

In the particular case of SiGe alloys deposited on Si substrates, typical growth temperatures in rapid thermal systems are between 600 and 750° C. It is known that near complete relaxation of SiGe layers can be accomplished in this temperature range, with threading dislocation densities on the order of mid-$10^5$ cm$^{-2}$ to $10^6$ cm$^{-2}$. Although this density is much lower than the ~$10^8$ cm$^{-2}$ density achieved with direct growth of the final SiGe layer directly on the Si substrate (without the graded layer), it is generally desired to achieve the lowest threading dislocation density possible. By annealing the layers in-between deposition as described (anneal temperatures greater than 900° C. for germanium concentrations less than 50% or so), dislocation densities <mid-$10^5$ cm$^{-2}$ can be achieved.

The annealing step can be performed after more than one growth step if the lattice mismatch increase is small enough at each interface. However, if fairly large steps (near 1% mismatch) are deposited, an annealing step is required after every growth step.

Figure 2:
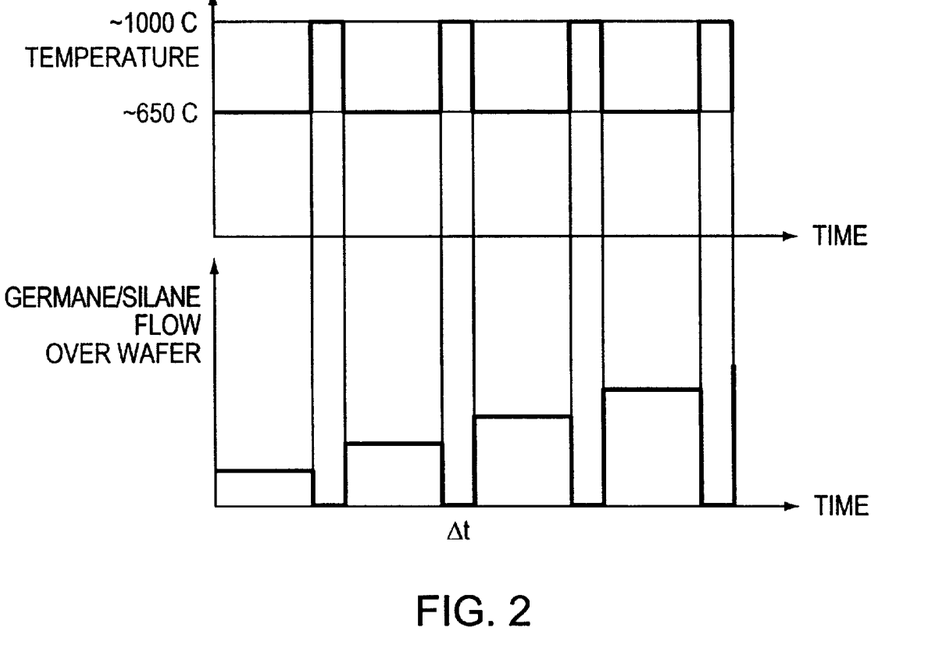
FIG. 2 is a graph showing the temperature changes and gas flows in a chemical vapor deposition system utilized in accordance with an exemplary embodiment of the invention.

The process conditions required for the invention are shown in FIG. 2, using SiGe alloy deposition as an example. The figure shows growth temperature as well as germane and silane flow versus time for implementation in a CVD system. The temperature is cycled between the growth temperature and the annealing temperature using the rapid thermal feature of the reactor. The key aspect is that the gas is not flowing during the high temperature annealing sequences. Using this method, gas phase nucleation of germane is avoided while still achieving the low dislocation densities associated with high temperature growth.

The use of the invention can be elucidated through the example of the relaxed SiGe/Si system. In this materials system, relaxed SiGe alloys on Si have many useful applications such as high-speed electronics. As can be shown from dislocation kinetics theory in mismatched layers, the rate of lattice mismatch strain relief in a lattice-mismatched film is given by:

$$\frac{\partial \delta}{\partial t} = \frac{\rho_t b}{2} B Y^m \varepsilon_{\mathit{eff}}^m e^{\frac{-U}{kT}} \quad (1)$$

where $\delta$ is the strain relieved by threading dislocation flow (and thereby misfit dislocation creation), $\rho_t$ is the threading dislocation density at the top surface, b is the Burgers vector of the dislocation, B is a constant extracted from dislocation velocity measurements, Y is the biaxial modulus, $\varepsilon_{\mathit{eff}}$ is the effective strain in the layer, U is the activation energy for dislocation glide, and T is the temperature of growth.

Realizing that the time derivative of plastic deformation is the 'grading rate' in a graded epitaxial layer, equation (1) can be written in a more practical form for those engineering dislocations in graded structures:

$$\rho_t = \frac{2 R_g R_{gr} e^{\frac{U}{kT}}}{b B Y^m \varepsilon_{\mathit{eff}}^m} \quad (2)$$

where $R_g$ is the film growth rate and $R_{gr}$ is the film grading rate.

Figure 3:
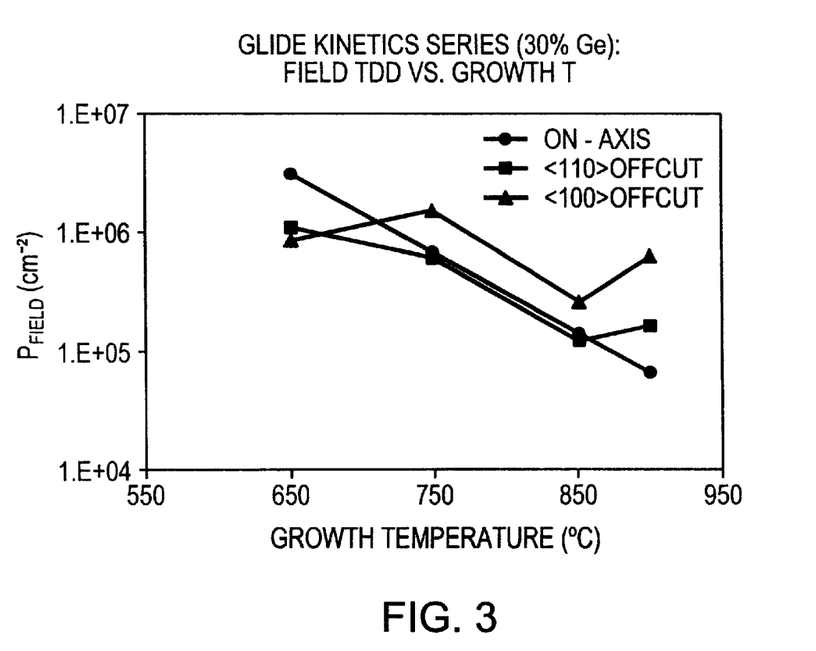
FIG. 3 is a graph showing threading dislocation density at the relaxed SiGe surface vs. growth temperature in SiGe graded layers on Si substrates.

For the particular case of the SiGe graded layer system on Si, the parameters for equation (2) have been extracted experimentally. FIG. 3 shows a plot of threading dislocation density vs. temperature for SiGe graded layers grown in a CVD reactor. All relaxed buffers were graded to 30% Ge as a final composition with a 1.5 $\mu$m final uniform cap layer. It is important to note that threading dislocation densities in graded layers in different CVD reactors have been studied, and it is noted here that the parameters can change slightly with a particular reactor or change in environment cleanliness. However, the numbers shown will not vary significantly, especially on a semilog plot. If an activation energy for dislocation glide is extracted from FIG. 3, the result is an activation energy of 1.38 eV.

Figure 4:
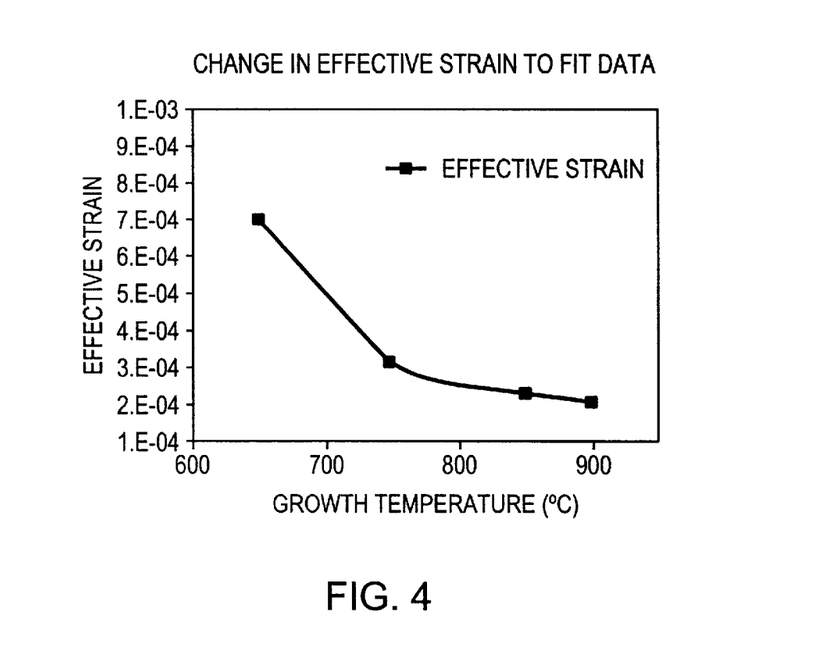
FIG. 4 is a graph showing the change in effective strain vs. growth temperature to fit the experimental data with an activation energy of 2.25.

It is well known that activation energy for dislocation glide in the SiGe system is approximately 2.25 eV and not the extracted value of 1.38 eV. This discrepancy occurs since the extracted value assumes that the effective strain is constant with temperature, when in reality it is not. Thus, if one desires to use the formulations described herein, one must account for the change in effective strain with temperature. FIG. 4 is a plot of the effective strain calculated using equation (2) under the assumption that the activation energy for dislocation glide is 2.25 eV. The effective strain drops with increasing growth temperature and is approximately in the $1 \times 10^{-4}$–$3 \times 10^{-4}$ range for growths above 750° C.

It is also clear from FIGS. 3 and 4 that for growth temperatures equal to or greater than 1000° C., dislocation densities much less than $10^5$ cm$^{-2}$ are possible. However, as was stipulated previously, such high growth temperatures using high concentrations of germane in the gas flow (desired for high, economical growth rates) results in disastrous gas phase nucleation.

Figure 5:
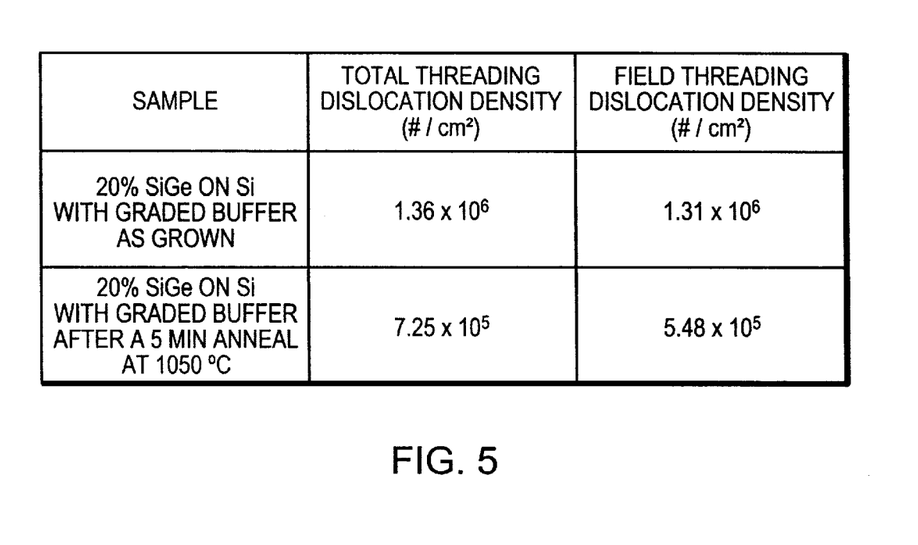
FIG. 5 is a chart showing total and field threading dislocation densities for 20% SiGe on a 0–20% graded buffer (graded at 10% Ge/$\mu$m) with and without a high temperature annealing step after growth in which epitaxial growths were performed at 700–750° C.

Using the invention, one can grow at reasonable growth rates at 750° C., avoid gas phase nucleation, but achieve lower threading dislocation densities by annealing at a higher temperature without gas flow. FIG. 5 demonstrates the effect annealing can have on dislocation density by summarizing etch-pit density (EPD) measurements for SiGe samples grown with and without a post-epi, high temperature anneal.

The samples are 20% SiGe layers on SiGe graded buffers graded from 0–20% at a rate of 10% Ge/$\mu$m. The threading dislocation densities in the SiGe were measured as grown (growth temperature of 700–750° C.), and with a 5 minute anneal at 1050° C. performed after growth. As a result of the anneal, the total threading dislocation density decreased from $1.36 \times 10^6$ cm$^{-2}$ to $7.25 \times 10^5$ cm$^{-2}$, and the field threading dislocation density decreased from $1.31 \times 10^6$ cm$^{-2}$ to $5.48 \times 10^5$ cm$^{-2}$. Incorporating anneals throughout the grading process as described in this disclosure enables the production of films with total dislocation densities well below $10^5$ cm$^{-2}$.

One can estimate the time that one needs to pause at the annealing temperature ($\Delta t$ in FIG. 2). This time is determined by ensuring that the dislocations have propagated as far as possible. A conservative estimate of this travel length can be extracted from FIGS. 3 and 4, with the additional information from x-ray diffraction that samples grown at T>750C are approximately completely relaxed. The average length of a misfit dislocation (and therefore length a threading dislocation has traveled) is:

$$\lambda_{AVG} = \frac{\rho_\lambda}{\rho_t} = \frac{1}{S\rho_t} = \frac{\delta}{b_{eff}\rho_t} \quad (3)$$

where $\rho_\lambda$ is the interface dislocation density (inverse of the interface dislocation spacing, S). For the 30% Ge alloy example, $\rho=1.22\times10^{-2}$ for complete relaxation. This results in a total misfit length per thread of approximately 5 cm using equation 3. Since the experiments were performed on 4-inch (10 cm) substrates, it is possible that a significant number are escaping at the edges of the wafer.

It must be remembered that the total length of 5 cm is distributed over a number of interfaces in a graded layer. In the case of graded SiGe, typically a graded layer is composed of, for example, 15 layers, each layer with an increment of 2% Ge. If one also imagines a typical grading rate of 10% Ge/$\mu$m, each of the 15 layers is 2000Å thick. Thus, each thread is creating about 5 cm/15=0.33 cm of misfit length in each interface.

Since the expression $$v = BY^m \varepsilon_{eff}^m e^{\frac{-U}{kT}} \quad (4)$$

estimates the dislocation velocity, the minimum time ($\Delta t$) to ensure close to maximum relaxation is:

$$\Delta t = \frac{\lambda}{v} \approx 0.1 \text{ seconds} \quad (5)$$

where it is assumed that annealing occurs at 1100C. Thus, the annealing time required at the elevated temperature need not be longer than a matter of seconds to ensure that the layer or layers grown at the reduced temperature have traveled their maximum length and created the lowest possible threading dislocation density. This calculation verifies that the invention is well suited to a CVD reactor with a low thermal mass in the substrate area, such as a rapid thermal CVD system.

A structure and method for creating relaxed mismatched films with low threading dislocation density, by avoiding growth during high temperature cycles and thus avoiding particle nucleation in rapid thermal CVD systems has been described. The particular case of SiGe/Si has been used to exemplify the growth sequence and parameters. However, the invention can also be utilized to lower defect densities in the compositional grading of other materials such as InGaAs and InGaP.

Although the invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
   a substrate;
   a lattice-mismatched first layer deposited on said substrate and annealed at a temperature greater than 100° C. above the deposition temperature; and
   a second layer deposited on said first layer with a greater lattice mismatch to said substrate than said first layer.

2. The semiconductor structure of claim 1, wherein said substrate comprises Si and said first and second layers comprise $Si_{1-x}Ge_x$.

3. The semiconductor structure of claim 1, wherein said substrate has a surface layer comprising Si and said first and second layers comprise $Si_{1-x}Ge_x$.

4. The semiconductor structure of claim 1, wherein said substrate comprises GaAs and said first and second layers comprise $In_yGa_{1-y}As$.

5. The semiconductor structure of claim 1, wherein said substrate has a surface layer comprising GaAs and said first and second layers comprise $In_yGa_{1-y}As$.

6. The semiconductor structure of claim 1, wherein said substrate comprises GaP and said first and second layers comprise $In_zGa_{1-z}P$.

7. The semiconductor structure of claim 1, wherein said substrate has a surface layer comprising GaP and said first and second layers comprise $In_zGa_{1-z}P$.

8. The semiconductor structure of claim 2, wherein said first and second layers differ by a Ge concentration less than 10% Ge.

9. The semiconductor structure of claim 2, wherein said first and second layers differ in Ge concentration by approximately 1.5% Ge.

10. The semiconductor structure of claim 2, wherein said first and second layers of $Si_{1-x}Ge_x$ are deposited at a growth temperature less than 850° C.

11. The semiconductor structure of claim 2, wherein said annealing occurs at a temperature greater than 900° C.

12. The semiconductor structure of claim 2, wherein anneal time is greater than 0.1 seconds.

13. The semiconductor structure of claim 2, wherein said first and second layers differ in Ge concentration by approximately 1.5%, the growth temperature is approximately 750° C., and the anneal temperature is approximately 1050° C.

14. The semiconductor structure of claim 2, wherein said first and second layers differ in Ge concentration by approximately 1.5%, the growth temperature is approximately 750° C., and the anneal temperature is approximately 1050° C., and the anneal time is greater than 0.1 seconds.

15. The semiconductor structure of claim 1, wherein said lattice-mismatched semiconductor layer is deposited by chemical vapor deposition.

16. A semiconductor graded composition layer structure on a semiconductor substrate comprising:
   a semiconductor substrate;
   a first semiconductor layer having a series of lattice-mismatched semiconductor layers deposited on said substrate and annealed at a temperature greater than 100° C. above the deposition temperature;
   a second semiconductor layer deposited on said first semiconductor layer with a greater lattice mismatch to said substrate than said first semiconductor layer, and annealed at a temperature greater than 100° C. above the deposition temperature of said second semiconductor layer.

17. The structure of claim 16, wherein said substrate comprises Si and said first and second layers comprise $Si_{1-x}Ge_x$.

18. The structure of claim 16, wherein said substrate has a surface layer comprising Si and said first and second layers comprise $Si_{1-x}Ge_x$.

19. The structure of claim 16, wherein said substrate comprises GaAs and said first and second layers comprise $In_yGa_{1-y}As$.

20. The structure of claim 16, wherein said substrate has a surface layer comprising GaAs and said first and second layers comprise $In_yGa_{1-y}As$.

21. The structure of claim 16, wherein said substrate comprises GaP and said first and second layers comprise $In_zGa_{1-z}P$.

22. The structure of claim 16, wherein said substrate has a surface layer comprising GaP and said first and second layers comprise $In_zGa_{1-z}P$.

23. The structure of claim 17, wherein sequential layers in the graded composition layers differ by a Ge concentration less than 10% Ge.

24. The structure of claim 17, wherein sequential layers in the graded composition layers differ in Ge concentration by approximately 1.5% Ge.

25. The structure of claim 17, wherein said first and second layers are deposited at a growth temperature of less than 850° C.

26. The structure of claim 17, wherein said annealing occurs at a temperature greater than 900° C.

27. The structure of claim 17, wherein anneal time is greater than 0.1 seconds.

28. The structure of claim 17, wherein sequential layers in the graded composition layers differ in Ge concentration by approximately 1.5%, the growth temperature is approximately 750° C., and the anneal temperature is approximately 1050° C.

29. The structure of claim 17, wherein sequential layers in the graded composition layers differ in Ge concentration by approximately 1.5%, the growth temperature is approximately 750° C., and the anneal temperature is approximately 1050° C., and the anneal time is greater than 0.1 seconds.

30. The semiconductor structure of claim 16, wherein said lattice-mismatched semiconductor layer is deposited by chemical vapor deposition.

* * * * *

(12) INTER PARTES REEXAMINATION CERTIFICATE (0046th)
United States Patent
Fitzgerald (10) Number: US 6,518,644 C1
(45) Certificate Issued: Jan. 13, 2009

(54) LOW THREADING DISLOCATION DENSITY RELAXED MISMATCHED EPILAYERS WITHOUT HIGH TEMPERATURE GROWTH

(75) Inventor: Eugene A. Fitzgerald, Windham, NH (US)

(73) Assignee: Amberwave Systems Corporation, Salem, NH (US)

Reexamination Request:
No. 95/000,158, Jul. 21, 2006

Reexamination Certificate for:
Patent No.: 6,518,644
Issued: Feb. 11, 2003
Appl. No.: 09/761,508
Filed: Jan. 16, 2001

Related U.S. Application Data
(60) Provisional application No. 60/177,085, filed on Jan. 20, 2000.

(51) Int. Cl.
H01L 21/02 (2006.01)
H01L 21/20 (2006.01)
C30B 25/02 (2006.01)

(52) U.S. Cl. .............. 257/616; 257/191; 257/E21.125; 438/478

(58) Field of Classification Search .............. None
See application file for complete search history.

(56) References Cited

U.S. PATENT DOCUMENTS

| | | | |
|---|---|---|---|
| 4,010,045 A | 3/1977 | Ruehrwein | 117/102 |
| 4,710,788 A | 12/1987 | Dambkes et al. | 257/194 |
| 4,987,462 A | 1/1991 | Kim et al. | 257/192 |
| 4,990,979 A | 2/1991 | Otto et al. | 257/321 |
| 4,997,776 A | 3/1991 | Harame et al. | 438/313 |
| 5,013,681 A | 5/1991 | Godbey et al. | 438/459 |
| 5,091,767 A | 2/1992 | Bean et al. | 257/190 |
| 5,097,630 A | 3/1992 | Maeda et al. | 451/65 |
| 5,155,571 A | 10/1992 | Wang et al. | 257/19 |
| 5,159,413 A | 10/1992 | Calviello et al. | 505/191 |

(Continued)

FOREIGN PATENT DOCUMENTS

| | | |
|---|---|---|
| DE | 41 01 167 | 7/1992 |
| EP | 0 514018 | 11/1992 |
| EP | 0 587 520 | 3/1994 |
| EP | 0 683 522 | 11/1995 |
| EP | 0 828 296 | 3/1998 |

(Continued)

OTHER PUBLICATIONS

Kissinger et al., "Stepwise Equilibrated Graded GexSi1–x Buffer With Very Low Threading Dislocation Density on Si(001)", Applied Physics Letters, 66 (16), Apr. 17, 1995, pp. 2083–2085.*

Van Zant, Microchip Fabrication, 4th ed. McGraw–Hill: New York, 2000, pp. 31 and 37.*

(Continued)

*Primary Examiner*—Erik Kielin (57) ABSTRACT

A semiconductor structure and method of processing same including a substrate, a lattice-mismatched first layer deposited on the substrate and annealed at a temperature greater than 100° C. above the deposition temperature, and a second layer deposited on the first layer with a greater lattice mismatch to the substrate than the first semiconductor layer. In another embodiment there is provided a semiconductor graded composition layer structure on a semiconductor substrate and a method of processing same including a semiconductor substrate, a first semiconductor layer having a series of lattice-mismatched semiconductor layers deposited on the substrate and annealed at a temperature greater than 100° C. above the deposition temperature, a second semiconductor layer deposited on the first semiconductor layer with a greater lattice mismatch to the substrate than the first semiconductor layer, and annealed at a temperature greater than 100° C. above the deposition temperature of the second semiconductor layer.

U.S. PATENT DOCUMENTS

| | | | |
|---|---|---|---|
| 5,166,084 A | 11/1992 | Pfiester | 438/151 |
| 5,177,583 A | 1/1993 | Endo et al. | 257/190 |
| 5,202,284 A | 4/1993 | Kamins et al. | 117/95 |
| 5,207,864 A | 5/1993 | Bhat et al. | 438/455 |
| 5,212,110 A | 5/1993 | Pfiester et al. | 438/222 |
| 5,241,197 A | 8/1993 | Murakami et al. | 257/192 |
| 5,250,445 A | 10/1993 | Bean et al. | 438/474 |
| 5,285,086 A | 2/1994 | Fitzgerald, Jr. | 257/85 |
| 5,291,439 A | 3/1994 | Kauffmann et al. | 365/185.16 |
| 5,298,452 A | 3/1994 | Meyerson | 438/508 |
| 5,310,451 A | 5/1994 | Tejwani et al. | 438/459 |
| 5,316,958 A | 5/1994 | Meyerson | 117/88 |
| 5,346,848 A | 9/1994 | Grupen-Shemansky et al. | 438/406 |
| 5,374,564 A | 12/1994 | Bruel et al. | 438/455 |
| 5,387,796 A | 2/1995 | Joshi et al. | 250/370.12 |
| 5,399,522 A | 3/1995 | Ohori et al. | 438/493 |
| 5,413,679 A | 5/1995 | Godbey | 438/702 |
| 5,424,243 A | 6/1995 | Takasaki et al. | 438/493 |
| 5,425,846 A | 6/1995 | Koze et al. | 438/492 |
| 5,426,069 A | 6/1995 | Selvakumar et al. | 438/60 |
| 5,426,316 A | 6/1995 | Mohammad | 257/197 |
| 5,434,102 A | 7/1995 | Watanabe et al. | 438/3 |
| 5,442,205 A | 8/1995 | Brasen et al. | |
| 5,461,243 A | 10/1995 | Ek et al. | 257/190 |
| 5,461,250 A | 10/1995 | Burghartz et al. | 257/347 |
| 5,462,883 A | 10/1995 | Dennard et al. | 438/459 |
| 5,476,813 A | 12/1995 | Naruse et al. | 438/311 |
| 5,479,033 A | 12/1995 | Baca et al. | 257/192 |
| 5,484,664 A | 1/1996 | Kitahara et al. | 428/641 |
| 5,523,243 A | 6/1996 | Mohammad | 438/312 |
| 5,523,592 A | 6/1996 | Nakagawa et al. | 257/96 |
| 5,534,713 A | 7/1996 | Ismail et al. | |
| 5,536,361 A | 7/1996 | Kondo et al. | |
| 5,540,785 A | 7/1996 | Dennard et al. | |
| 5,596,527 A | 1/1997 | Tomioka et al. | |
| 5,617,351 A | 4/1997 | Bertin et al. | 365/185.05 |
| 5,630,905 A | 5/1997 | Lynch et al. | 438/507 |
| 5,633,516 A | 5/1997 | Mishima et al. | 257/190 |
| 5,659,187 A | 8/1997 | Legoues et al. | 257/190 |
| 5,683,934 A | 11/1997 | Candelaria | 438/151 |
| 5,698,869 A | 12/1997 | Yoshimi et al. | 257/192 |
| 5,714,777 A | 2/1998 | Ismail et al. | 257/263 |
| 5,728,623 A | 3/1998 | Mori et al. | 438/455 |
| 5,739,567 A | 4/1998 | Wong | 257/316 |
| 5,759,898 A | 6/1998 | Ek et al. | 438/291 |
| 5,777,347 A | 7/1998 | Bartelink | 257/24 |
| 5,786,612 A | 7/1998 | Otani et al. | 257/316 |
| 5,786,614 A | 7/1998 | Chuang et al. | 257/318 |
| 5,792,679 A | 8/1998 | Nakato | 438/162 |
| 5,801,085 A | 9/1998 | Kim et al. | 438/524 |
| 5,808,344 A | 9/1998 | Ismail et al. | 257/369 |
| 5,828,114 A | 10/1998 | Kim et al. | 257/401 |
| 5,847,419 A | 12/1998 | Imai et al. | 257/192 |
| 5,859,654 A | 1/1999 | Radke et al. | 357/45 |
| 5,859,864 A | 1/1999 | Jewell | 372/45.012 |
| 5,877,070 A | 3/1999 | Goesele et al. | 438/458 |
| 5,891,769 A | 4/1999 | Liaw et al. | 438/167 |
| 5,906,708 A | 5/1999 | Robinson et al. | 438/694 |
| 5,906,951 A | 5/1999 | Chu et al. | 438/751 |
| 5,912,479 A | 6/1999 | Mori et al. | 257/192 |
| 5,943,560 A | 8/1999 | Chang et al. | 438/151 |
| 5,963,817 A | 10/1999 | Chu et al. | 438/410 |
| 5,966,622 A | 10/1999 | Levine et al. | 438/459 |
| 5,998,807 A | 12/1999 | Lustig et al. | 257/66 |
| 6,010,937 A | 1/2000 | Karam et al. | 438/363 |
| 6,013,134 A | 1/2000 | Chu et al. | 118/715 |
| 6,030,884 A | 2/2000 | Mori et al. | 438/455 |
| 6,033,974 A | 3/2000 | Henley et al. | 438/526 |
| 6,033,995 A | 3/2000 | Muller | 438/749 |
| 6,039,803 A | 3/2000 | Fitzgerald et al. | 117/89 |
| 6,058,044 A | 5/2000 | Sugiura et al. | 365/185.17 |
| 6,059,895 A | 5/2000 | Chu et al. | 148/33.1 |
| 6,074,919 A | 6/2000 | Gardner et al. | 438/287 |
| 6,096,590 A | 8/2000 | Chan et al. | 438/233 |
| 6,103,559 A | 8/2000 | Gardner et al. | 438/183 |
| 6,111,267 A | 8/2000 | Fischer et al. | 257/19 |
| 6,124,614 A | 9/2000 | Ryum et al. | 257/347 |
| 6,130,453 A | 10/2000 | Mei et al. | 257/315 |
| 6,133,799 A | 10/2000 | Favors, Jr. et al. | 331/57 |
| 6,140,687 A | 10/2000 | Shimomura et al. | 257/401 |
| 6,143,636 A | 11/2000 | Forbes et al. | 438/587 |
| 6,153,495 A | 11/2000 | Kub et al. | 438/459 |
| 6,154,475 A | 11/2000 | Soref et al. | 372/45.011 |
| 6,160,303 A | 12/2000 | Fattaruso | 257/531 |
| 6,162,688 A | 12/2000 | Gardner et al. | 438/289 |
| 6,184,111 B1 | 2/2001 | Henley et al. | 438/514 |
| 6,191,006 B1 | 2/2001 | Mori et al. | 438/455 |
| 6,191,007 B1 | 2/2001 | Matsui et al. | 438/459 |
| 6,191,432 B1 | 2/2001 | Sugiyama et al. | 257/19 |
| 6,194,722 B1 | 2/2001 | Fiorini et al. | 250/338.1 |
| 6,204,529 B1 | 3/2001 | Lung et al. | 257/314 |
| 6,207,977 B1 | 3/2001 | Augusto et al. | 257/192 |
| 6,210,988 B1 | 4/2001 | Howe et al. | 438/50 |
| 6,218,677 B1 | 4/2001 | Broekaert | 257/22 |
| 6,232,138 B1 | 5/2001 | Fitzgerald et al. | 438/46 |
| 6,235,567 B1 | 5/2001 | Huang | 438/202 |
| 6,242,324 B1 | 6/2001 | Kub et al. | 438/455 |
| 6,249,022 B1 | 6/2001 | Lin et al. | 257/324 |
| 6,251,755 B1 | 6/2001 | Furukawa et al. | 438/510 |
| 6,261,929 B1 | 7/2001 | Gehrke et al. | 438/478 |
| 6,266,278 B1 | 7/2001 | Harari et al. | 365/185.18 |
| 6,271,551 B1 | 8/2001 | Schmitz et al. | 257/288 |
| 6,271,726 B1 | 8/2001 | Fransis et al. | 330/254 |
| 6,291,321 B1 | 9/2001 | Fitzgerald | 438/494 |
| 6,313,016 B1 | 11/2001 | Kibbel et al. | 438/478 |
| 6,316,301 B1 | 11/2001 | Kant | 438/197 |
| 6,323,108 B1 | 11/2001 | Kub et al. | 438/458 |
| 6,329,063 B2 | 12/2001 | Lo et al. | 428/450 |
| 6,335,546 B1 | 1/2002 | Tsuda et al. | 257/94 |
| 6,339,232 B1 | 1/2002 | Takagi et al. | 257/192 |
| 6,350,993 B1 | 2/2002 | Chu et al. | 257/19 |
| 6,368,733 B1 | 4/2002 | Nishinaga et al. | 428/698 |
| 6,372,356 B1 | 4/2002 | Thornton et al. | 428/469 |
| 6,399,970 B2 | 6/2002 | Kubo et al. | 257/194 |
| 6,403,975 B1 | 6/2002 | Brunner et al. | 257/15 |
| 6,406,589 B1 | 6/2002 | Yanagisawa et al. | 156/345.3 |
| 6,407,406 B1 | 6/2002 | Tezuka et al. | 257/18 |
| 6,420,937 B1 | 7/2002 | Akatsuka et al. | 331/74 |
| 6,425,951 B1 | 7/2002 | Chu et al. | 117/3 |
| 6,429,061 B1 | 8/2002 | Rim | 438/198 |
| 6,482,749 B1 | 11/2002 | Billington et al. | 438/745 |
| 6,503,773 B2 | 1/2003 | Fitzgerald | 438/37 |
| 6,515,335 B1 | 2/2003 | Christiansen et al. | 257/347 |
| 6,518,644 B2 | 2/2003 | Fitzgerald | 257/616 |
| 6,521,041 B2 | 2/2003 | Wu et al. | 117/94 |
| 6,525,338 B2 | 2/2003 | Mizushima et al. | 257/19 |
| 6,555,839 B2 | 4/2003 | Fitzgerald | 257/18 |
| 6,573,126 B2 | 6/2003 | Cheng et al. | 438/149 |
| 6,576,532 B1 | 6/2003 | Jones et al. | 438/481 |
| 6,583,015 B2 | 6/2003 | Fitzgerald et al. | 438/287 |
| 6,593,191 B2 | 7/2003 | Fitzgerald | 438/282 |
| 6,594,293 B1 | 7/2003 | Bulsara et al. | 372/43.01 |
| 6,602,613 B1 | 8/2003 | Fitzgerald | 428/641 |
| 6,603,156 B2 | 8/2003 | Rim | 257/190 |
| 2001/0003364 A1 | 6/2001 | Sugawara et al. | 257/192 |
| 2001/0014570 A1 | 8/2001 | Wenski et al. | 451/41 |
| 2002/0043660 A1 | 4/2002 | Yamazaki et al. | 257/59 |
| 2002/0052084 A1 | 5/2002 | Fitzgerald | 438/282 |
| 2002/0084000 A1 | 7/2002 | Fitzgerald | 148/33.2 |
| 2002/0096717 A1 | 7/2002 | Chu et al. | 257/347 |

| | | | |
|---|---|---|---|
| 2002/0100942 | A1 | 8/2002 | Fitzgerald et al. ............ 257/369 |
| 2002/0123167 | A1 | 9/2002 | Fitzgerald .................... 438/47 |
| 2002/0123183 | A1 | 9/2002 | Fitzgerald ................... 438/199 |
| 2002/0123197 | A1 | 9/2002 | Fitzgerald et al. ........... 438/285 |
| 2002/0125471 | A1 | 9/2002 | Fitzgerald et al. ............ 257/19 |
| 2002/0125497 | A1 | 9/2002 | Fitzgerald ................... 257/191 |
| 2002/0168864 | A1 | 11/2002 | Cheng et al. ................ 438/312 |
| 2002/0185686 | A1 | 12/2002 | Christiansen et al. ....... 257/347 |
| 2003/0003679 | A1 | 1/2003 | Doyle et al. ................ 438/406 |
| 2003/0013323 | A1 | 1/2003 | Hammond et al. .......... 438/770 |
| 2003/0025131 | A1 | 2/2003 | Lee et al. .................... 257/200 |
| 2003/0034529 | A1 | 2/2003 | Fitzgerald et al. ........... 257/369 |
| 2003/0041798 | A1 | 3/2003 | Wenski et al. ................. 117/84 |
| 2003/0057439 | A1 | 3/2003 | Fitzgerald ................... 257/192 |
| 2003/0077867 | A1 | 4/2003 | Fitzgerald ................... 438/285 |

FOREIGN PATENT DOCUMENTS

| | | |
|---|---|---|
| EP | 0 829 908 | 3/1998 |
| EP | 0 838 859 | 4/1998 |
| EP | 1 020 900 | 7/2000 |
| EP | 1 174 928 | 1/2002 |
| GB | 2 342 777 | 4/2000 |
| JP | 2-210816 | 8/1990 |
| JP | 3-036717 | 2/1991 |
| JP | 4-307974 | 10/1992 |
| JP | 5-166724 | 7/1993 |
| JP | 61-14116 | 4/1994 |
| JP | 6-177046 | 6/1994 |
| JP | 6-244112 | 9/1994 |
| JP | 7-94420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000-031491 | 1/2000 |
| JP | 2000-513507 | 10/2000 |
| JP | 2001-319935 | 11/2001 |
| JP | 2002-076334 | 3/2002 |
| JP | 2002-164520 | 6/2002 |
| JP | 2002-289533 | 10/2002 |
| JP | 2002-356399 | 12/2002 |
| WO | 98/59365 | 12/1998 |
| WO | 99/53539 | 10/1999 |
| WO | 00/48239 | 8/2000 |
| WO | 00/54338 | 9/2000 |
| WO | 01/22482 | 3/2001 |
| WO | 01/54175 | 7/2001 |
| WO | 01/54202 | 7/2001 |
| WO | 01/93338 | 12/2001 |
| WO | 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |
| WO | 03/015140 | 2/2003 |

OTHER PUBLICATIONS

G. Kissinger et al., "Stepwise Equilibrated Graded $Ge_xSi_{1-x}$ Buffers Grown by APCVD," Electrochemical Society Proceedings, vol. 96–5, (1996), pp. 366–373.

J. Katcki et al., "Formation of Dislocations in InGaAs/GaAs Heterostructures," phys. stat. sol. (a) 171, 275 (1999).

T.E. Crumbaker et al., "Heteroepitaxy of InP on Si: Reduction of defects by substrate misorientation and thermal annealing," J. Vac. Sci. Technol. B 8 (2), Mar./Apr. 1990, pp. 261–265.

Crumbaker et al., "Heteroepitaxy of InP on Si: Reduction of Defects substrate misorientation and thermal annealing," J. Vac. Sci. Technol. B 8 (2), pp. 261–265 (Mar./Apr. 1990).

Request for Inter Partes Reexamination of U.S. Patent No. 6,503,773, Jul. 11,2006.

Corrected Request for Inter Partes Reexamination of U.S. Patent No. 6,503,773, Aug. 21, 2006.

Office Action in Inter Partes Reexamination of U.S. Patent No. 6,503,773, Oct. 27, 2006.

Request for Inter Partes Reexamination of U.S. Patent No. 6,864,115, Sep. 5, 2006.

Armstrong et al., "Design of Si/SiGe Heterojunction Complementary Metal–Oxide–Semiconductor Transistors," *IEDM Technical Digest (1995 International Electron Devices Meeting)*, pp. 761–764.

Armstrong, "Technology for SiGe Heterostructure–Based CMOS Devices," PhD Thesis, Massachusetts Institute of Technology, 1999, pp. 1–154.

Augusto et al., "Proposal for a New Process Flow for the Fabrication of Silicon–Based Complementary MOD–MOSFETs without Ion Implantation," *Thin Solid Films*, vol. 294, No. 1–2 (Feb. 15, 1997), pp. 254–258.

Barradas et al., "RBS analysis of MBE–grown SiGe/(001) Si heterostructures with thin, high Ge content SiGe channels for HMOS transistors," *Modern Physics Letters B*, vol. 15 (2001), abstract.

Borenstein et al., "A New Ultra–Hard Etch–Stop Layer for High Precision Micromachining," Proceedings of the 1999 12th IEEE International Conference on Micro Electro Mechanical Systems (MEMs) (Jan. 17–21, 1999), pp. 205–210.

Bouillon et al., "Search for the optical channel architecture for 0.18/0.12 μm bulk CMOS experimental study," *IEEE* (1996), pp. 21.2.1–21.2.4.

Bruel et al., "®Smart Cut: A Promising New SOI Material Technology," Proceedings of the 1995 IEEE International SOI Conference (Oct. 1995), pp. 178–179.

Bruel, "Silicon on Insulator Material Technology," *Electronic Letters*, vol. 13, No. 14 (Jul. 6, 1995), pp. 1201–1202.

Bufler et al., "Hole transport in strained Si1–xGex alloys on Si1–yGey substrates," *Journal of Applied Physics*, vol. 84, No. 10 (Nov. 15, 1998), pp. 5597–5602.

Bulsara et al., "Relaxed $In_xGa_{1-x}As$ Graded Buffers Grown with Organometallic Vapor Phase Epitaxy on GaAs," *Applied Physics Letters*, vol. 72, Issue 13 (Jul. 30, 1998), pp. 1608–1610.

Bulsara, "Materials Issues with the Integration of Lattice–Mismatched InxGa1–xAs on GaAs," PhD Thesis, MIT, Jun. 1998, pp. 1–178.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100–104.

Buttard et al., "Toward Two–Dimensional Self–Organization of Nanostructures Using Wafer Bonding and Nanopatterned Silicon Surfaces," *IEEE—2002 Journal of Quantum Electronics*, vol. 38, Issue 8 (Aug. 2002), pp. 995–1005.

Canaperi et al., "Preparation of a relaxed Si–Ge layer on an insulator in fabricating high–speed semiconductor devices with strained epitaxial film," International Business Machines Corporation, USA (2002), abstract.

Carlin et al., "High Efficiency GaAs–on–Si Solar Cells with High Voc using Graded Gesi Buffers," *IEEE—2000* (2000), pp. 1006–1011.

Carlin et al., "Investigation and Development of High Quality GaAs–on–Si for Space Photovoltaics Using a Graded GeSi," PhD Thesis, Ohio State University, 2001, pp. 1–232.

Chang et al., "Selective Etching of SiGe/Si Heterostructures," *Journal of the Electrochemical Society*, No. 1 (Jan. 1991), pp. 202–204.

Charasse et al., "MBE Growth of GaAs on Si at Thomson," *Institute of Electronic Structure and Laser*.

Cheng et al., "Electron Mobility Enhancement in Strained–Sin–MOSFETs Fabricated on SiGe–on–Insulator (SGOI) Substrates," *IEEE Electron Device Letters*, vol. 22, No. 7 (Jul. 2001), pp. 321–323.

Cheng et al., "Relaxed Silicon–Germanium on Insulator Substrate by Layer Transfer," *Journal of Electronic Materials*, vol. 30, No. 12 (2001) pp. L37–L39.

Crumbaker et al., "The Influence of Dislocation Density on Electron Mobility in InP Films on Si," *Applied Physics Letters*, vol. 59, Issue 9 (Aug. 26, 1991), pp. 1090–1092.

Cullis et al., "Growth ripples upon strained SiGe epitaxial layers on Si and misfit dislocation interactions," *Journal of Vacuum Science and Technology A*, vol. 12, No. 4 (Jul./Aug. 1994), pp. 1924–1931.

Currie et al., "Carrier mobilities and process stability of strained Si n– and p–MOSFETs on SiGe virtual substrates," *Journal of Vacuum Science and Technology B*, vol. 19, No. 6 (Nov./Dec. 2001), pp. 2268–2279.

Currie et al., "Controlling Threading Dislocation Densities in Ge on Si Using Graded SiGe Layers and Chemical–Mechanical Polishing," *Applied Physics Letters*, vol. 72, Issue 14 (Apr. 6, 1998), pp. 1718–1720.

Currie, "SiGe Virtual Substrate Engineering for Integration of III–V Materials, Microelectromechanical Systems and Strained Silicon Mosfets with Silicon," PhD Thesis, MIT, 2001, pp. 1–190.

Dilliway et al., "Characterization of Morphology and Defects in Silicon Germanium Virtual Substrates," *Journal of Materials Science*, vol. 11, Issue 7 (2000), pp. 549–556.

Eaglesham et al., "Dislocation–Free Stranski–Krastanow Growth of Ge on Si(100)," *Physical Review Letters*, vol. 64, No. 16 (Apr. 16, 1990), pp. 1943–1946.

Erdtmann et al., "Gainas/Inp Quantum Well Infrared Photodetectors on Si Substrate for Low–Cost Focal Plan Arrays," PhD Thesis, Northwestern University, 2000, pp. 1–225.

Examination Report for European Patent Application No. 01902072.6–2203, issue May 27, 2003.

Feichtinger et al., "Misfit Dislocation Nucleation Study in p/p+ Silicon," *Journal of the Electrochemical Society*, 148 (7) (2001), pp. G379–G382.

Feijoo et al., "Epitaxial Si–Ge Etch Stop Layers with Ethylene Diamine Pyrocatechol for Bonded and Etchback Silicon–on–Insulator," *Journal of Electronic Materials*, vol. 23, No. 6 (Jun. 1994), pp. 493–496.

Fischetti et al., "Band structure, deformation potentials, and carrier mobility in strained Si, Ge, and SiGe alloys," *Journal of Applied Physics*, vol. 80, No. 4 (Aug. 15, 1996), pp. 2234–2252.

Fischetti, "Long–range Coulomb interactions in small Si devices, Part II. Effective electronmobility in thin–oxide structures," *Journal of Applied Physics*, vol. 89, No. 2 (Jan. 15, 2001), pp. 1232–1250.

Fitzgerald, "Dislocations in strained–layer epitaxy: theory, experiment, and applications," *Materials Science Reports*, vol. 7 (1991), pp. 87–142.

Fitzgerald et al., "Dislocation dynamics in relaxed graded composition semiconductors," *Materials Science and Engineering*, B67 (1999), pp. 53–61.

Fitzgerald et al., "Totally Relaxed GexSi1–x Layers with Low Threading Dislocation Densities Grown on Si Substrates," *Applied Physics Letters*, vol. 59, No. 7 (Aug. 12, 1991), pp. 811–813.

Garone et al., "Silicon vapor phase epitaxial growth catalysis by the presence of germane," *Applied Physics Letters*, vol. 56, No. 13 (Mar. 26, 1990), pp. 1275–1277.

Giovane et al., "Strain–Balanced Silicon–Germanium Materials for Near IR Photodetection in Silicon–Based Optical Interconnects, " PhD Thesis, MIT, 1998, pp. 1–134.

Gray et al., "Analysis and Design of Analog Integrated Circuits," John Wiley & Sons, 1984, pp. 605–632.

Grillot et al., "Acceptor diffusion and segregation in (AlxGa1–x)0.5In0.5P heterostructures," *Journal of Applied Physics*, vol. 91, No. 8 (Apr. 15, 2002), pp. 4891–4899.

Groenert et al., "Strategies for Direct Monolithic Integration of AlxGa(1–x)As/InxGa(1–x)As LEDS and Lasers on Ge/GeSi/Si Substrates Via Relaxed Graded GexSi(1–x) Buffer Layers," *Materials Research Society Symposium Proceedings*, vol. 692 (2002), pp. H.9.30.1–H.9.30.6.

Grützmacher et al., "Ge segregation in SiGe/Si heterostructures and its dependence on deposition technique and growth atmosphere," *Applied Physics Letters*, vol. 63, No. 18 (Nov. 1, 1993), pp. 2531–2533.

Hackbarth et al., "Alternatives to thick MBE–grown relaxed SiGe buffers," *Thin Solid Films*, vol. 369, No. 1–2 (Jul. 2000), pp. 148–151.

Hackbarth et al., "Strain relieved SiGe buffers for Si–based heterostructure field–effect transistors," *Journal of Crystal Growth*, vol. 201/202 (1999), pp. 734–738.

Herzog et al., "SiGe–based FETs: buffer issues and device results," *Thin Solid Films*, vol. 380 (2000), pp. 36–41.

Höck et al., "Carrier mobilities in modulation doped Si1–xGex heterostructures with respect to FET applications," *Thin Solid Films*, vol. 336 (1998), pp. 141–144.

Höck et al., "High hole mobility in Si0.17 Ge0.83 channel metal–oxide–semiconductor field–effect transistors grown by plasma–enhanced chemical vapor deposition," *Applied Physics Letters*, vol. 76. No. 26 (Jun. 26, 2000), pp. 3920–3922.

Höck et al., "High performance 0.25 μm p–type Ge/SiGe MODFETs," *Electronic Letters*, vol. 34, No. 19 (Sep. 17, 1998), pp. 1888–1889.

Houghton, "Stain Relaxation Kinetics in $Si_{1-x}Ge_x$/Si Heterostructures," *Journal of Applied Physics*, vol. 70, No. 4 (Aug. 15, 1991), pp. 2136–2151.

Hsu et al., "Near Field Scanning Optical Microscopy Studies of Electronic and Photonic Materials and Devices," *Materials Science and Engineering Report: A Review Journal*, vol. 33 (2001), pp. 1–50.

Hsu et al., "Surface morphology of related GexSi1–x films," *Applied Physics Letters*, 61 (11) (Sep. 14, 1992), pp. 1293–1295.

Huang et al., "High–quality strain–relaxed SiGe alloy grown on implanted silicon–on–insulator substrate," *Applied Physics Letters*, vol. 76, No. 19 (May 8, 2000), pp. 2680–2682.

Huang et al., "The Impact of Scaling Down to Deep Submicron on CMOS RF Circuits," *IEEE Journal of Solid–State Circuits*, vol. 33, No. 7 (Jul. 1998), pp. 1023–1036.

International Search Report for PCT/US01/01413.

Ishikawa et al., "Creation of Si–Ge–based SIMOX structures by low energy oxygen implantation," Proceedings of the 1997 IEEE International SOI Conference (Oct. 1997), pp. 16–17.

Ishikawa et al., "SiGe–on–insulator substrate using SiGe alloy grown Si(001)," *Applied Physics Letters*, vol. 75, No. 7 (Aug. 16, 1999), pp. 983–985.

Ismail et al., "Modulation–doped n–type Si/SiGe with inverted interface," *Applied Physics Letters*, vol. 65, No. 10 (Sep. 5, 1994), pp. 1248–1250.

Ismail, "Si/SiGe High–Speed Field–Effect Transistors," Eelctron Devices Meeting, Washington, D.C. (Dec. 10, 1995), pp. 20.1.1–20.1.4.

Katcki et al., "Formation of Dislocations in InGaAs/GaAs Heterostructures," phys. stat. sol. (a) pp. 275 (1999).

Kearney et al., "The effect of alloy scattering on the mobility of holes in a $Si_{1-x}Ge_x$ quantum well," *Semiconductor Science and Technology*, vol. 13 (1998), pp. 174–180.

Kim et al., "A Fully Integrated 1.9–GHz CMOS Low–Noise Amplifier," *IEEE Microwave and Guided Wave Letters*, vol. 8, No. 8 (Aug. 1998), pp. 293–295.

Kissinger et al., "Stepwise Equilibrated Graded $Ge_xSi_{1-x}$ Buffer with Very Low Threading Dislocation Density on Si(001)," 66 Applied Physics Letters 2083 (1995).

Kissinger et al., "Stepwise Equilibrated Graded $Ge_xSi_{1-x}$ Buffers Grown by APCVD," Electrochemical Soc'y Proceedings, vol. 96–5, pp. 366–373 (1996).

Knall et al., "The Use of Graded in GaAs Layers and Patterned Substrates to Remove Threading Dislocations From GaAs on Si," *Journal of Applied Physics*, vol. 76, Issue 5 (Sep. 1, 1994), pp. 2697–2702.

Koester et al., "Extremely High Transconductance Ge/Si0.4Ge0.6 p–MODFET's Grown by UHV–CVD," *IEEE Electron Device Letters*, vol. 21, No. 3 (Mar. 2000), pp. 110–112.

König et al., "Design Rules for n–Type SiGe Hetero FETs," *Solid State Electronics*, vol. 41, No. 10 (1997), pp. 1541–1547.

König et al., "p–Type Ge–Channel MODFET's with High Transconductance Grown on Si Substrates," *IEEE Electron Device Letters*, vol. 14, No. 4 (Apr. 1993), pp. 205–207.

König et al., "SiGe HBTs and HFETs," *Solid–State Electronics*, vol. 38, No. 9 (1995), pp. 1595–1602.

Kummer et al., "Low energy plasma enhanced chemical vapor deposition," *Materials Science and Engineering*, B89 (2002), pp. 288–295.

Kuznetsov et al., "Technology for high–performance n–channel SiGe modulation–dope field–effect transistors," *Journal of Vacuum Science and Technology*, B 13(6) (Nov./Dec. 1995), pp. 2892–2896.

Langdo, "High Quality Ge on Si by Epitaxial Necking," *Applied Physics Letters*, vol. 76, Issue 25 (Jun. 19, 2000), pp. 3700–3702.

Larson, "Integrated Circuit Technology Options for RFIC's Present Status and Future Directions," *IEEE Journal of Solid–State Circuits*, vol. 33, No. 3 (Mar. 1998), pp. 387–399.

Lee et al., "CMOS RF Integrated Circuits at 5 GHz and Beyond," *Proceedings of the IEEE*, vol. 88, No. 10 (Oct. 2000), pp. 1560–1571.

Lee et al., "Strained Ge channel p–type metal–oxide–semiconductor field–effect transistors grown on $Si_{1-x}Ge_x$/Si virtual substrates," *Applied Physics Letters*, vol. 79, No. 20 (Nov. 12, 2001), pp. 3344–3346.

Lee et al., "Strained Ge channel p–type MOSFETs fabricated on $Si_{1-x}Hex$/Si virtual substrates," *Materials Research Society Symposium Proceedings*, vol. 686 (2002), pp. A1.9.1–A1.9.5.

LeGoues et al., "Relaxation of SiGe Thin Films Grown on Si/SiO2 Substrates," *Journal of Applied Physics*, vol. 75, Issue 11 (Jun. 1, 1974), pp. 2730–2738.

Leitz et al., "Channel Engineering of SiGe–Based Heterostructures for High Mobility MOSFETs," *Materials Research Society Symposium Proceedings*, vol. 686 (2002), pp. A3.10.1–A3.10.6.

Leitz et al., "Dislocation glide and blocking kinetics in compositionally graded SiGe/Si," *Journal of Applied Physics*, vol. 90, No. 6 (Sep. 15, 2001), pp. 2730–2736.

Leitz et al., "Hole mobility enhancements in strained $Si/Si_{1-y}Ge_y$ p–type metal–oxide–semiconductor field–effect transistors grown on relaxed $Si_{1-x}Ge_x$ (x<y) virtual substrates," *Applied Physics Letters*, vol. 79, No. 25 (Dec. 17, 2001), pp. 4246–4248.

Li et al., "Design of high speed Si/SiGe heterojunction complementary metal–oxide–semiconductor field effect transistors with reduced short–channel effects," *Journal of Vacuum Science and Technology A*, vol. 20, No. 3 (May/Jun. 2002), pp. 1030–1033.

Liu et al., "Growth Study of Surfactant–Mediated Relaxed SiGe Graded Layers for 1.55–µM Photodetector Applications," *Thin Solid Films*, vol. 380, Issue 1–2 (2000), pp. 54–56.

Liu et al., "High–Quality Ge Films on Si Substrates Using SB Surfactant–Mediated Graded SiGe Buffers," *Applied Physics Letters*, vol. 79, Issue 21 (Nov. 19, 2001), pp. 3431–3433.

Lu et al., "High Performance 0.1 µm Gate–Length P–Type SiGe MODFET's and MOS–MODFET's," *IEEE Transactions on Electron Devices*, vol. 47, No. 8 (Aug. 2000), pp. 1645–1652.

Luo et al., "High–Quality Strain–Relaxed SiGe Films Grown with Low Temperature Si Buffer," *Journal of Applied Physics*, vol. 89, Issue 13 (Sep. 23, 1991), pp. 1611–1613.

Maiti et al., "Strained–Si heterostucture field effect transistors," *Semiconductor Science and Technology*, vol. 13 (1998), pp. 1225–1246.

Maszara, "Silicon–On–Insulator by Wafer Bonding: A Review," *Journal of the Electrochemical Society*, No. 1 (Jan. 1991), pp. 341–347.

Meyerson et al., "Cooperative Growth Phenomena in Silicon/Germanium Low–Temperature Epitaxy," *Applied Physics Letters*, vol. 53, No. 25 (Dec. 19, 1988), pp. 2555–2557.

Mizuno et al., "Advanced SOI–MOSFETs with Strained–Si Channel for High Speed CMOS–Electron/Hole Mobility Enhancement," 2002 Symposium on VLSI Technology, Honolulu (Jun. 13–15), IEEE New York, pp. 210–211.

Mizuno et al., "Electron and Hole Mobility Enhancement in Strained–Si MOSFET's on SiGe–on–Insulator Substrates Fabricated by SIMOX Technology," *IEEE Electron Device Letters*, vol. 21, No. 5 (May 2000), pp. 230–232.

Mizuno et al., "High Performance Strained–Si p–MOSFET's on SiGe–on–Insulator Substrates Fabricated by SIMOX Technology," *IEEE IDEM Technical Digest* (1999 International Electron Device Meeting), pp. 934–936.

Momose et al., "Dislocation–Free and Lattice–Matched Si/GAP1–xNx/Si Structure for Photo–Electronic Integrated Systems," *Applied Physics Letters*, vol. 79, Issue 25 (Dec. 17, 2001), pp. 4151–4153.

Monroe et al., "Comparison of Mobility–Limiting Mechanisms in High–Mobility Si1–xGex Heterostructures," *Journal of Vacuum Science and Technology B*, vol. B11, Issue 4 (Jul./Aug. 1993), pp. 1731–1737.

Nayak et al., "High–Mobility Strained–Si PMOSFET's," *IEEE Transaction on Electron Devices*, vol. 43, No. 10 (Oct. 1996), pp. 1709–1716.

Oh et al., "Interdigitated Ge P–I–N Photodetectors Fabricated on a Si Substrate Using Graded SiGe Buffer Layers," *IEEE—Journal of Quantum Electronics*, vol. 38, Issue 9 (Sep. 2002), pp. 1238–1241.

Ohori et al., "Effect of Threading Dislocations on Mobility in Selectively Doped Heterostrcutures Grown on Si Substrates," *Journal of Applied Physics*, vol. 75, Issue 7 (Apr. 1, 1994), pp. 3681–3683.

O'Neill et al., "SiGe virtual substrate N–channel heterojunction MOSFETS," *Semiconductor Science and Technology*, vol. 14 (1999), pp. 784–789.

Ota, "Application of heterojunction FET to power amplifier for cellular telephone," *Electronic Letters*, vol. 30, No. 11(May 26, 1994), pp. 906–907.

Papananos, "Radio–Frequency Microelectronic Circuits for Telecommunication Applications," Kluwer Academic Publishers, 1999, pp. 115–117, 188–193.

Parker et al., "SiGe heterostructure CMOS circuits and applications," *Solid State Electronics*, vol. 43 (1999), pp. 1497–1506.

Powell et al., "New Approach to the Growth of Low Dislocation Relaxed SiGe Material," *Applied Physics Letters*, vol. 64, Issue 14 (Apr. 4, 1994), pp. 1856–1858.

Ransom et al., "Gate–Self–Aligned n–channel and p–channel Germanium MOSFET's" *IEEE Transactions on Electron Devices*, vol. 38, No. 12 (Dec. 1991), pp. 2695.

Reinking et al., "Fabrication of high–mobility Ge p–channel MOSFETs on Si substrates," *Electronics Letters*, vol. 35, No. 6 (Mar. 18, 1999), pp. 503–504.

Rim, "Application of Silicon–Based Heterostructures to Enhanced Mobility Metal–Oxide–Semiconductor Field–Effect Transistors," PhD Thesis, Stanford University, 1999, pp. 1–184.

Rim et al., "Enhanced Hole Mobilities in Surface–Channel Strained–Si p–MOSFETs," *IEDM* (1995), pp. 517–520.

Rim et al., "Fabrication and Analysis of Deep Submicron Strained–SiN–MOSFET's," *IEEE Transactions on Electron Devices*, vol. 47, No. 7 (Jul. 2000), pp. 1406–1415.

Robbins et al., "A model for heterogeneous growth of Si1–xGex films for hydrides," *Journal of Applied Physics*, vol. 69, No. 6 (Mar. 15, 1991), pp. 3729–3732.

Sadek et al., "Design of Si/SiGe Heterojunction Complementary Metal–Oxide–Semiconductor Transistors," *IEEE Transactions on Electron Devices* (Aug. 1996), pp. 1224–1232.

Sakaguchi et al., "ELTRAN® by Splitting Porous Si Layers," Proceedings of the 195$^{th}$ International SOI Symposium, vol. 99–3 (1999), pp. 117–121.

Sakai et al., "Reduction of Threading Dislocation Density in SiGe Layers on Si (001) Using a Two–Step Strain—Relaxation Procedure," *Applied Physics Letters*, vol. 79, Issue 21 (Nov. 19, 2001), pp. 3398–3400.

Samavedam et al., "Novel Dislocation Structure and Surface Morphology Effects in Relaxed Ge/Si–Ge (graded) / Si Structures," *Journal of Applied Physics*, vol. 87, Issue 7 (Apr. 1, 1997), pp. 3108–3116.

Schäffler, "High–Mobility Si and Ge Structures," *Semiconductor Science and Technology*, vol. 12 (1997), pp. 1515–1549.

Schimmel, "Defect Etch for <100> Silicon Evaluation," *Journal of the Electrochemical Society*, vol. 126, No. 3 (Mar. 1979), pp. 479–482.

Sugimoto et al., "A 2V, 500 MHz and 3V, 920 MHz Low–Power Current–Mode 0.6 μm CMOS VCO Circuit," *IEICE Trans Electron*, vol.E82–C, No. 7 (Jul. 1999), pp. 1327–1329.

Taylor et al., "Optoelectronic Device Performance on Reduced Threading Dislocation Density GaAs/Si," *American Institute of Physics*, vol. 89, Issue 8 (Apr. 15, 2001), pp. 4365–4375.

Tement et al., "Metal Gate Strained Silicon MOSFETs for Microwave Integrated Circuits," *IEEE* (Oct. 2000), pp. 38–43.

Ting et al., "Monolithic Integration of III–V Materials and Devices on Silicon," *SPIE Conference 1999–Silicon Based Optoelectronics*, vol. 3630 (Jan. 1999), pp. 19–28.

Tsang et al., "Measurements of alloy composition and strain in thin $Ge_xSi_{1-x}$ layers," *Journal of Applied Physics*, vol. 75, No. 12 (Jun. 15, 1994), pp. 8098–8108.

Tweet et al., "Factors determining the composition of strained GeSi layers grown with disilane and germane," *Applied Physics Letters*, vol. 65, No. 20 (Nov. 14, 1994), pp. 2579–2581.

Usami et al., "Spectroscopic study of Si–based quantum wells with neighboring confinement structure," *Semiconductor Science and Technology*, (1997), abstract.

Valtuena et al., "Influence of the Surface Morphology on the Relaxation of Low–Strained InxGa1–x As Linear Buffer Structures," *Journal of Crystal Growth*, vol. 182 (1997), pp. 281–291.

Van Zant, Microchip Fabrication, 4th ed., pp. 31 & 37 (McGraw–Hill: New York, 2000).

Watson et al., "Relaxed, Low Threading Defect Density Si0.7Ge0.3 Epitaxial Layers Grown on Si by Rapid Thermal Chemical Vapor Deposition," *Journal of Applied Physics*, vol. 75, Issue 1 (Jan. 1, 1994), pp. 263–269.

Welser et al., "Electron Mobility Enhancement in Strained–Si N–Type Metal–Oxide–Semiconductor Field–Effect Transistors," *IEEE Electron Device Letters*, vol. 15, No. 3 (Mar. 1994), pp. 100–102.

Welser et al., "Evidence of Real–Space Hot–Electron Transfer in High Mobility, Strained–Si Multilayer MOSFETs," *IEEE IDEM Technical Digest* (1993 International Electron Devices Meeting), pp. 545–548.

Welser et al., "NMOS and PMOS Transistors Fabricated in Strained Silicon/Relaxed Silicon–Germanium Structures," *IEEE IDEM Technical Digest* (1992 International Electron Devices Meeting), pp. 1000–1002.

Welser, "The Application of Strained Silicon/Relaxed Silicon Germanium Heterostructures to Metal–Oxide–Semiconductor Field–Effect Transistors," PhD Thesis, Stanford University, 1994, pp. 1–205.

Wolf et al., "Silicon Processing for the VLSI Era, vol. 1: Process Technology," Lattice Press, Sunset Beach, CA, 1986, pp. 384–386.

Xie et al., "Fabrication of High Mobility Two–Dimentional Electron and Hole Gases in GeSi/Si," *Journal of Applied Physics*, vol. 73 Issue 12 (Jun. 15, 1993), pp. 8364–8370.

Xie et al., "Semiconductor Surface Roughness: Dependence on Sign and Magnitude of Bulk Strain," *The Physical Review Letters*, vol. 73, No. 22 (Nov. 28, 1994), pp. 3006–3009.

Xie et al., "Very High Mobility Two–Dimentional Hole Gas in Si/GexSi1–x/Ge Structures Grown by Molecular Beam Epitaxy," *Applied Physics Letters*, vol. 63, Issue 16 (Oct. 18, 1993), pp. 2263–2264.

Xie, "SiGe Field Effect Transistors," *Materials Science and Engineering*, vol. 25 (1999), pp. 89–121.

Yamagata et al., "Bonding, Splitting and Thinning by Porous Si in ELTRAN®; SOI–Epi Wafer™," *Materials Research Society Symposium Proceedings*, vol. 681E (2001), pp. I8.2.1–I8.2.10.

Yeo et al., "Nanoscale Ultra–Thin–Body Silicon–on–Insulator P–MOSFET with a SiGe/Si Heterostructure Channel," *IEEE Electron Device Letters*, vol. 21, No. 4 (Apr. 2000), pp. 161–163.

Zhang et al., "Demonstration of a GaAs–Based Complaint Substrate Using Wafer Bonding and Substrate Removal Techniques," Electronic Materials and Processing Research Laboratory, Department of Electrical Engineering, University Park, PA 16802, 1998, pp. 25–28.

"How to Make Silicon," Wacker University, http://www.wafernet.com/PresWK/h–pti–as3_wsc_siltronic_com_pages_training_pages_Silic..., Aug. 28, 2002.

"Optimal Growth Technique and Structure for Strain Relaxation of Si–Ge Layers on Si Substrates," *IBM Technical Disclosure Bulletin*, vol. 32, No. 8A (Jan. 1990), pp. 330–331.

"2 Bit/Cell EEPROM Cell Using Band to Band Tunneling for Data Read–Out," *IBM Technical Disclosure Bulletin*, vol. 35, No. 4B (Sep. 1992), pp. 136–140.

Office action in Japanese Patent Application No. 2001–553,568, Jul. 18, 2006, 3 pages (translation).

Examination Report for European Patent Application No. 01 902 072.6–2203, dated Jan. 22, 2004 (4 pages).

Examination Report and Summons to Attend Oral Proceedings for European Patent Application No. 01 902 072.6–2203, dated Aug. 18, 2004 (5 pages).

Wolf et al., "Silicon Processing for the VLSI Era, vol. 1: Process Technology," Lattice Press, Sunset Beach, CA, 1986, pp. 57–58, 307.

Thompson et al., Electromagnetic Annealing for the 100nm Technology Node, pp. 1–3.

\* cited by examiner

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1–30 are cancelled.

* * * * *